(12) United States Patent
Kang et al.

(10) Patent No.: US 12,278,110 B2
(45) Date of Patent: Apr. 15, 2025

(54) BIAS VOLTAGE MODULATION APPROACH FOR SiO/SiN LAYER ALTERNATING ETCH PROCESS

(71) Applicant: Applied Materials, Inc., Santa Clara, CA (US)

(72) Inventors: Sean Kang, Santa Clara, CA (US); Olivier Luere, Sunnyvale, CA (US); Kenji Takeshita, Santa Clara, CA (US); Sanghyuk Choi, Palo Alto, CA (US); Mengnan Zou, Sunnyvale, CA (US); Zihao Ding, Fremond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 601 days.

(21) Appl. No.: 17/572,397

(22) Filed: Jan. 10, 2022

(65) Prior Publication Data

US 2023/0223268 A1 Jul. 13, 2023

(51) Int. Cl.
*H01L 21/3065* (2006.01)
*H01L 21/02* (2006.01)
*H01L 21/311* (2006.01)

(52) U.S. Cl.
CPC .... *H01L 21/3065* (2013.01); *H01L 21/02126* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 5,505,816 | A | 4/1996 | Barnes et al. |
| 5,880,036 | A | 3/1999 | Becker et al. |
| 7,049,244 | B2 | 5/2006 | Becker et al. |
| 8,969,212 | B2 | 3/2015 | Ren et al. |
| 2002/0175144 | A1 | 11/2002 | Hung et al. |
| 2015/0200106 | A1* | 7/2015 | Guha ............... H01L 21/31144 438/706 |

(Continued)

FOREIGN PATENT DOCUMENTS

| | | |
|---|---|---|
| CN | 109983563 A | 7/2019 |
| TW | 201517167 A | 5/2015 |
| TW | 201626451 A | 7/2016 |

OTHER PUBLICATIONS

International Search Report and Written Opinion for Application PCT/US2022/049011 dated Mar. 15, 2023.

(Continued)

*Primary Examiner* — Stephanie P Duclair
(74) *Attorney, Agent, or Firm* — Patterson + Sheridan, LLP

(57) ABSTRACT

Embodiments of the present disclosure generally relate to a method for etching a film stack with high selectivity and low etch recipe transition periods. In one embodiment, a method for etching a film stack having stacked pairs of oxide and nitride layers is described. The method includes transferring a substrate having a film stack formed thereon into a processing chamber, providing a first bias voltage to the substrate, etching an oxide layer of the film stack while providing the first bias voltage to the substrate, providing a second bias voltage to the substrate, the second bias voltage greater than the first bias voltage, and etching a nitride layer of the film stack while providing the second bias voltage to the substrate.

21 Claims, 3 Drawing Sheets

(56) References Cited

U.S. PATENT DOCUMENTS

| | | |
|---|---|---|
| 2015/0279697 A1 | 10/2015 | Matsuda et al. |
| 2020/0063309 A1 | 2/2020 | Mahanty et al. |
| 2020/0251345 A1 | 8/2020 | Yin et al. |
| 2021/0066089 A1 | 3/2021 | Yokoyama et al. |
| 2021/0320012 A1 | 10/2021 | Shimizu et al. |
| 2021/0358762 A1 | 11/2021 | Oomori et al. |
| 2021/0407811 A1* | 12/2021 | Qin ........................ H10B 43/50 |
| 2022/0084837 A1 | 3/2022 | Takahashi et al. |

OTHER PUBLICATIONS

Taiwan Office Action for Application No. 111147169 dated Dec. 13, 2024.

* cited by examiner

BIAS VOLTAGE MODULATION APPROACH FOR SiO/SiN LAYER ALTERNATING ETCH PROCESS

BACKGROUND

Field

Embodiments of the present disclosure generally relate to a method for etching a film stack with high selectivity and low etch recipe transition periods.

Description of the Related Art

Production of very large scale integration (VLSI) and ultra large scale integration (ULSI) semiconductor devices involves reliably producing submicron and smaller features. However, with the continued miniaturization of circuit technology, the dimensions of the size and pitch of circuit features, such as interconnects, have placed additional demands on processing capabilities. In order to further increase device and interconnect density, the multilevel interconnects at the heart of this technology involve precise imaging and placement of high aspect ratio features, such as vias and other interconnect structures. Additionally, forming sub-micron size features and interconnects with reduced waste of intermediate materials, such as resists and hardmask materials, is sought after.

As feature sizes have become smaller, the demand for higher aspect ratios, defined as the ratio between the depth of the feature and the width of the feature, has steadily increased to 10:1 and even greater. Developing a film stack and etch processes that are capable of reliably forming features with such high aspect ratios presents a significant challenge. Inaccurate control or low resolution of the lithography exposure and developing process may lead to poor critical dimension of the various layers utilized to transfer features into a film stack, resulting in unacceptable line width roughness (LWR). Large line width roughness (LWR) and undesired wiggling profile can cause inaccurate feature transfer to the film stack, thus, eventually leading to device failure and yield loss.

Furthermore, high etch selectivities are required in transferring features onto multi-layered film stacks. To obtain these high etch selectivities, different etch recipes, including different process gas chemistries and different chamber pressures, must be utilized for each distinct material layer to allow for wider tuning of the etch. For example, in an alternating oxide-nitride film stack, different process gases flow into the chamber at different pressures in order to achieve a high etch selectivity between the layers. However, overall throughput and efficiency are dependent on the long transition period caused by etch recipe changes, such as process gas recipe changes (i.e., flow rates, gas types, pressures, etc.) between the nitride layer etch step and oxide layer etch step. Thus, changing the etch recipes between layers results in a loss in overall throughput and efficiency of the process chamber.

Accordingly, there is a need in the art for an improved method for etching multi-layer film stacks.

SUMMARY

In one embodiment, a method for etching a film stack having stacked pairs of oxide and nitride layers is described. The method includes transferring a substrate having a film stack formed thereon into a processing chamber, providing a first bias voltage to the substrate, etching an oxide layer of the film stack while providing the first bias voltage to the substrate, providing a second bias voltage to the substrate, the second bias voltage different than the first bias voltage, and etching a nitride layer of the film stack while providing the second bias voltage to the substrate. In one example, the second bias voltage is greater than the first bias voltage.

In another embodiment, a method for etching a film stack having stacked pairs of oxide and nitride layers is described. The method includes transferring a substrate having a film stack formed thereon into a process chamber, providing a process gas mixture to the substrate, the process gas mixture including $C_NF_M$, $C_XH_YF_Z$, and oxygen-containing gas, providing a first bias voltage to the substrate, etching a first oxide layer of the film stack while providing the first bias voltage to the substrate and while providing the process gas mixture to the substrate, providing a second bias voltage to the substrate, the second bias voltage different than the first bias voltage, etching a nitride layer of the film stack while providing the second bias voltage to the substrate and while providing the process gas mixture to the substrate, providing a third bias voltage to the substrate, the third bias voltage less than the second bias voltage, and etching a second oxide layer of the film stack while providing the third bias voltage to the substrate and while providing the process gas mixture to the substrate. In one example, the second bias voltage is greater than the first bias voltage.

In yet another embodiment, a method for etching a film stack having stacked pairs of silicon oxide and silicon nitride layers is provided. The method includes transferring a substrate having a film stack formed thereon into a process chamber, providing a process gas mixture to the substrate, the process gas mixture including $C_NF_M$, $C_XH_YF_Z$, and oxygen-containing gas, and wherein the oxygen-containing gas comprises from about 25% to about 50% of the process gas mixture by volume, providing a first bias voltage to the substrate, etching a first silicon oxide layer of the film stack while providing the first bias voltage to the substrate and while providing the process gas mixture to the substrate, providing a second bias voltage to the substrate, the second bias voltage different than the first bias voltage, etching a silicon nitride layer of the film stack while providing the second bias voltage to the substrate and while providing the process gas mixture to the substrate, providing the first bias voltage to the substrate, and etching a second silicon oxide layer of the film stack while providing the first bias voltage to the substrate and while providing the process gas mixture to the substrate. In one example, the second bias voltage is greater than the first bias voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The following disclosure describes high selectivity film stack etching. Certain details are set forth in the following description and in FIGS. 1-4 to provide a thorough understanding of various implementations of the disclosure. Other details describing well-known structures and systems often associated with high selectivity film stack etching are not set forth in the following disclosure to avoid unnecessarily obscuring the description of the various implementations. In addition, the apparatus description described herein is illustrative and should not be construed or interpreted as limiting the scope of the implementations described herein.

Many of the details, operations, dimensions, angles and other features shown in the figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Embodiments of the present disclosure generally relate to methods for etching a film stack with high etch selectivity and low transition periods when switching between etching different layers of the film stack. During conventional etching of multi-layer film stacks, different etch recipes are needed to etch each different type of material layer in order to obtain high etch selectivity between different types of materials comprising the stack. However, the transition period to change or alter etch recipe conditions decreases the efficiency and overall throughput. According to embodiments of the present disclosure, a multi-layer etch recipe is disclosed for etching multi-material film stack. The multi-layer etch recipe leverages different bias voltages to etch different materials comprising the multi-layer film stack substantially without changing the process gas mixture, flow rates or pressure in order to selectively etch the different materials of the multi-layer film stack while substantially reducing the time period conventionally needed to transition between etching of different materials within the multi-layer film stack. Since changing the bias voltage is less time consumptive compared to changing the pressure or process gas flow/chemistry for each different layer during a conventional etch process, the time to transition between etching different materials is dramatically reduced, resulting in the overall efficiency and throughput to be increased.

While the particular apparatus in which the implementations described herein can be practiced is not limited, the implementations are described herein as practiced within a SYM3® and/or a SYM3D® etch system available from Applied Materials, Inc., Santa Clara, Calif. Alternatively, implementations described herein may be practiced in other suitable apparatus, including those from other manufacturers.

Figure 1:
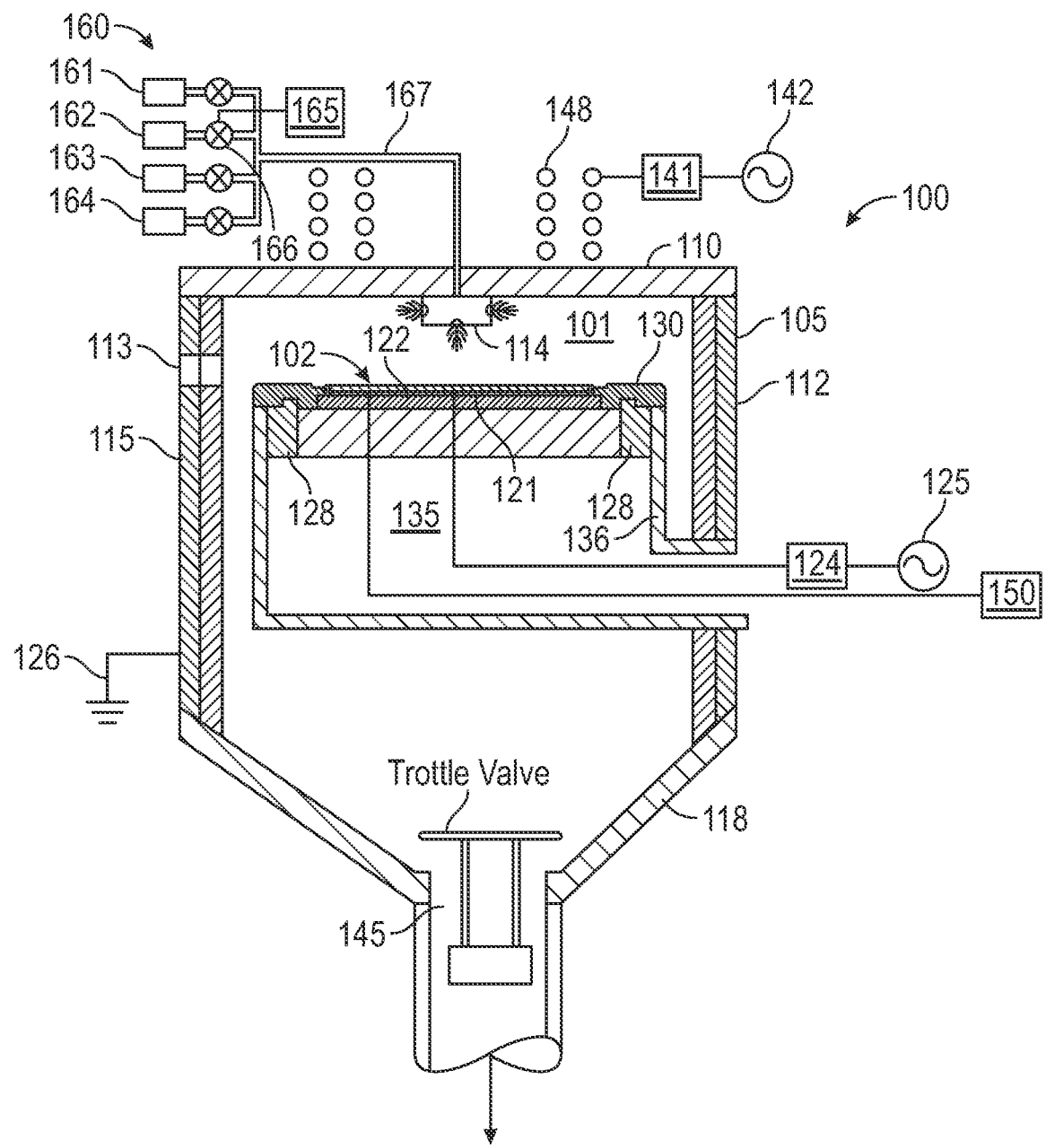
FIG. 1 illustrates a simplified cutaway schematic view for of one example of a plasma processing chamber suitable for etching a film stack disposed on a substrate according to one or more implementations of the present disclosure.

FIG. 1 is a simplified cutaway schematic view for of one example of a plasma processing chamber 100 suitable for etching a film stack disposed on a substrate 102. The plasma processing chamber 100 includes a chamber body 105 having a processing volume 101 defined therein. The chamber body 105 has sidewalls 112 and a bottom 118, which are coupled to an electrical ground 126. The dimensions of the chamber body 105 and related components of the plasma processing chamber 100 are not limited and can be proportionally larger than the size of the substrate 102 to be processed therein. Examples of substrate sizes include 200 mm diameter, 250 mm diameter, 300 mm diameter and 450 mm diameter, among others.

The chamber body 105 supports a chamber lid assembly 110 to enclose the processing volume 101. A substrate access port 113 is formed through the sidewall 112 of the chamber body 105, facilitating the transfer of the substrate 102 into and out of the plasma processing chamber 100. A pumping port 145 is defined through the chamber body 105 and connected to the processing volume 101. A throttle valve 147 is utilized to control the flow of gases out of the processing volume 101 through the pumping port 145. As shown in FIG. 1, the pumping port 145 is located in the chamber bottom 118 beneath a substrate support pedestal 135 that supports the substrate 103 during processing. A gas panel 160 is coupled by a gas line 167 to the chamber body 105 to supply process gases into the processing volume 101. The gas panel 160 can include one or more process gas sources 161, 162, 163, 164, and can additionally include inert gases, non-reactive gases, and reactive gases. Examples of process gases that can be provided by the gas panel 160 include, but are not limited to, $C_MF_N$-containing gases including $C_2F_4$, $C_4F_8$, $C_3F_6$, $C_4F_6$; $C_XH_YF_Z$-containing gases including $CHF_3$, $CH_2F_2$, $CH_3F$; oxygen-containing gases including $O_2$, $H_2O$, $H_2O_2$, $O_3$, $N_2O$, $NO_2$, and hydrogen-containing gases such as $H_2$. Additionally, process gases can include halogen-containing gases including $Cl_2$, HCl, HF, $F_2$, $Br_2$, HCl, HBr, $SF_6$, $NF_3$; passivation gases including nitrogen ($N_2$), carbonyl sulfide (COS), and sulfur dioxide ($SO_2$); and inert gases including argon, helium. In some embodiments, process gases can include nitrogen, chlorine, fluorine, oxygen and hydrogen containing gases such as $BCl_3$, $NF_3$, $NH_3$, $CO_2$, $SO_2$, CO, $N_2$, $NO_2$, $N_2O$ and $H_2$, among others.

Valves 166 control the flow of the process gases from the sources 161, 162, 163, 164 from the gas panel 160 and are managed by a system controller 165. The flow of the gases supplied to the chamber body 105 from the gas panel 160 can include combinations of the gases, i.e., a process gas mixture or process gases. The chamber lid assembly 110 can include a nozzle 114. The nozzle 114 has one or more ports for introducing the process gases from the sources 161, 162, 164, 163 of the gas panel 160 into the processing volume 101. After the process gases are introduced into the plasma processing chamber 100, the gases are energized to form plasma. An antenna 148, such as one or more inductor coils, can be provided adjacent to the plasma processing chamber 100, for example above lid assembly 110. A source power supply 142 provides source power to the antenna 148 through a match circuit 141 to inductively couple energy, such as RF energy, to the process gas disposed in the process volume 101 to maintain a plasma formed from the process gas. Alternatively, or in addition to the source power supply 142, process electrodes below the substrate 102 and/or above the substrate 102 can be used to capacitively couple RF source power to the process gases to maintain the plasma within the processing volume 101. The operation of the source power supply 142 is controlled by the system controller 165, which also controls the operation of other components in the plasma processing chamber 100.

As briefly discuss above, the substrate support pedestal 135 is disposed in the processing volume 101 to support the substrate 102 during processing. As shown in FIG. 1, the substrate support pedestal 135 supported from the sidewalls 112 of the processing chamber 100. The substrate support pedestal 135 can include an electrostatic chuck (ESC) 122 for holding the substrate 102 during processing. The ESC 122 uses the electrostatic attraction to hold the substrate 102 to the substrate support pedestal 135. The ESC 122 is powered by an RF power supply 125 integrated with a match circuit 124. The ESC 122 has an isolator 128 for the purpose of making the sidewall of the ESC 122 less attractive to the plasma to prolong the maintenance life cycle of the ESC 122. Additionally, the substrate support pedestal 135 can have a cathode liner 136 to protect the sidewalls of the substrate support pedestal 135 from the plasma gases and to extend the time between maintenance of the plasma processing chamber 100.

The substrate support pedestal 135 or ESC 122 includes an electrode 121 embedded within a dielectric body. A bias power supply 150 is coupled to the electrode 121 to provide bias voltage to the substrate 102. The bias voltage attracts ions present in the plasma formed from the process gases in the processing volume 101, which anisotropically etch the substrate 102 disposed on the ESC 122. The bias power supply 150 can provide a steady state bias voltage, cycle the bias voltage on and off, or pulse the bias voltage, during processing of the substrate 102. The bias power supply 150 may provide the bias voltage from about 0 kV to about 8 kV, such as from about 2 kV to about 8 kV or from about 0 kV to about 3 kV.

A cover ring 130 is disposed on the ESC 122 and along the periphery of the substrate support pedestal 135. The cover ring 130 is configured to protect the top surface of the substrate support pedestal 135 from the plasma environment inside the plasma processing chamber 100 during processing.

The system controller 165 can be utilized to control the process sequence, regulating the gas flows from the gas panel 160 into the plasma processing chamber 100, regulating the bias voltage from the bias power supply 150, and other process parameters. The system controller 165 further includes a processor, such as a CPU, and a memory storage. In some embodiments, the memory storage may store methods described herein and the processor may execute methods described herein. Software routines, when executed by the CPU, transform the CPU into a specific purpose computer (controller) that controls the plasma processing chamber 100 such that an etch process, such as described herein, is performed in accordance with the present disclosure. The software routines can also be stored and/or executed by a second controller (not shown) that is collocated with the plasma processing chamber 100.

Figure 2:
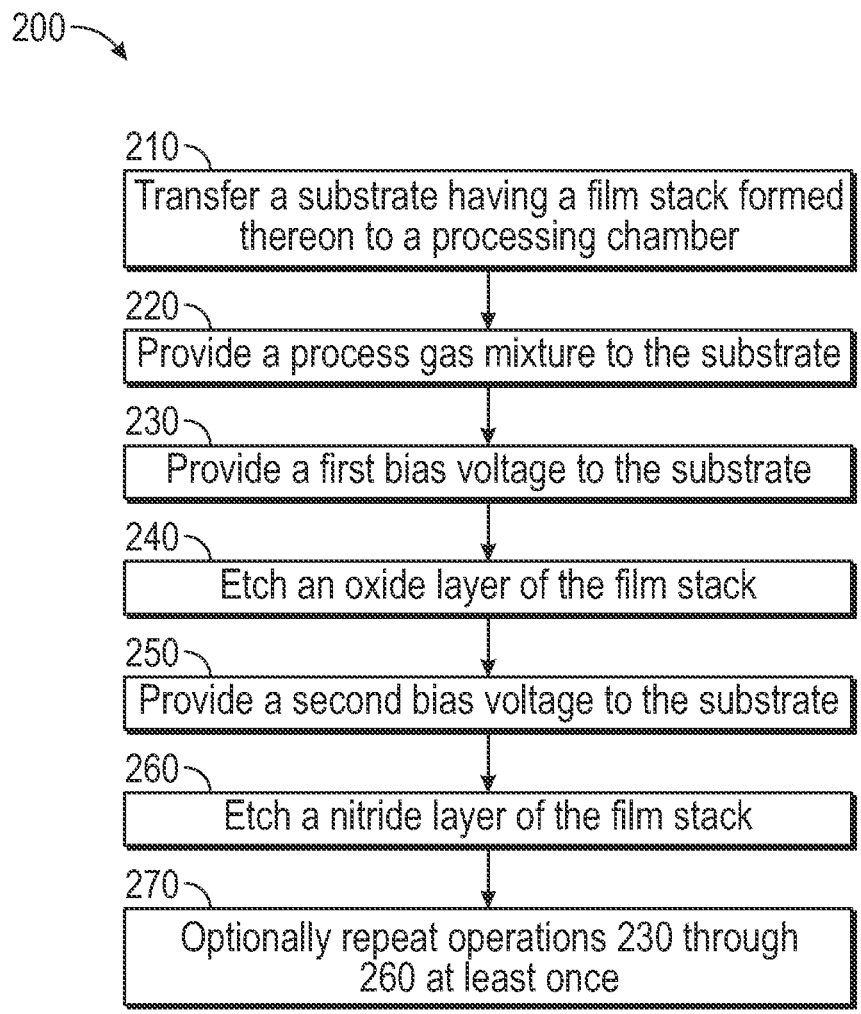
FIG. 2 illustrates a flow diagram of a method for performing an etch process on a film stack, such as that of illustrated in FIGS. 3A-3D, according to one or more embodiments of the present disclosure.

FIG. 2 is a flow diagram of a method 200 for performing an etch process on a film stack, such as that of illustrated in FIGS. 3A-3D, according to embodiments of the present disclosure. The method 200 may be stored as a software routine in the memory of, or be otherwise accessible by the system controller 165, such that the system controller 165, when executing the software routine, causes the plasma processing chamber 100 to perform the method. FIGS. 3A-3D illustrate various stages of a high selectivity etch process on a film stack 300 according to method 200. In some examples, the film stack 300 has alternating oxide and nitride layers, for example up to and even exceeding 128 pairs of oxide and nitride layers. The method 200 begins at operation 210 by transferring the substrate 102 into an etch processing system, such as the processing chamber 100 described above. The substrate 102 includes a film stack 300 and an etch mask 360. The etch mask 360 is disposed on top of the film stack 300 to facility etching portions of the film stack 300 exposed openings 362 formed through the etch mask 360. The etch mask 360 may be a photoresist layer, a hardmask layer, a combination of photoresist and hardmask layers, or other layer or layers suitable for masking the film stack 300 for pattern transfer via etching.

Figure 3A:
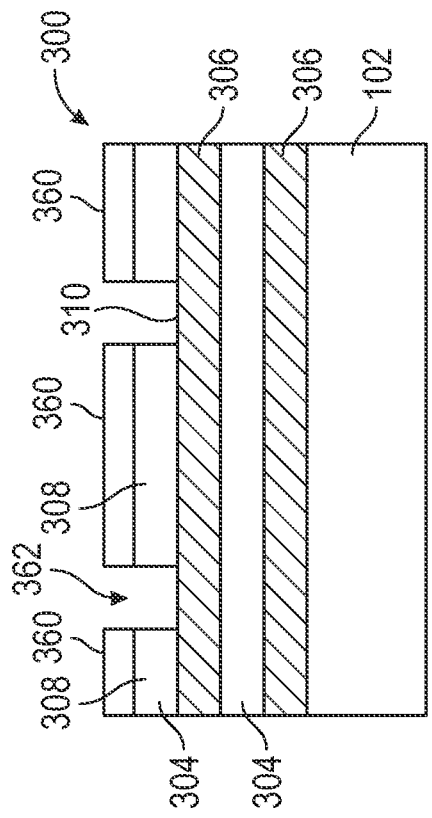
FIGS. 3A-3D illustrate various stages of a high selectivity etch process on a film stack 300 according to the method of FIG. 2.

The film stack 300 includes stacked pairs of alternating layers. Each pair of alternating layers includes an oxide layer 304 and a nitride layer 306, as shown in FIG. 3A. For convenience, only a total of 2 pairs of alternating layers 304 and 306 are shown FIG. 3A. In some embodiments, more than 4 pairs of alternating layers 304 and 306 are included in the film stack 300. For example, about 4 or more pairs of alternating layers, such as about 16 or more pairs of alternating layers, such as about 32 or more, about 64 or more, about 128 or more, or about 256 or more, pairs of alternating layers may be present in the film stack 300.

Each layer 304 and 306 may be from about 10 nanometers (nm) to about 40 nm thick, such as from about 20 nm to about 30 nm thick. The total thickness of the pair of alternating layers 304 and 306 may be from about 40 nm to about 16 micrometers (µm). In some embodiments of an alternating pair, the nitride layer 306 may be above the oxide layer 304. In other embodiments of an alternating pair, the oxide layer 304 may be above the nitride layer 306. In one example, the oxide layer 304 is silicon oxide while the nitride layer 306 is silicon nitride.

At operation 220, a process gas mixture flows into the processing chamber 100 at a substantially constant chamber pressure and source power. As used herein, "substantially constant" and "substantially the same" means equal or up to about ±5% of the compared values. In some embodiments, the pressure of the processing chamber 100 is from about 10 mTorr to about 40 mTorr, such as from about 15 mTorr to 35 mTorr or from about 20 mTorr to 30 mTorr. In some embodiments, the source power from the source power supply 142 may be from about 500 watts (W) to about 3000 W, such as from about 1000 W to about 2500 W or from about 1500 W to about 2000 W. It is contemplated that the source power may be modulated during the method 200 in order to aid in selectively etching the film stack 300.

In some examples, the process gas mixture may be chosen based on the dissociation energy of selected species at different bias voltages. Gases which have particular dissociation energies at different bias voltages may be useful for etching more than one material depending on the bias voltage applied. In some examples, a process gas mixture includes a process gas comprising carbon and fluorine is used in conjunction with a process gas comprising carbon, hydrogen, and fluorine and a process gas comprising oxygen. For example, a first gas mixture comprising and the process gas $C_M F_Y$ and the process gas $C_X H_Y F_Z$ may include from about 10% to about 50% $C_M F_Y$ by volume, such as from about 10% to about 40%, such as from about 10% to about 30%, such as about 20% to about 30%. In some examples, the process gas mixture including $C_M F_Y$ and $C_X H_Y F_Z$ also includes oxygen. For example, the process gas mixture of $C_M F_Y$, $C_X H_Y F_Z$, and oxygen may include from about 10% to about 60% oxygen by volume, such as from about 25% to about 50% oxygen, such as from about 30% to about 45% oxygen, such as about 35% to about 40% oxygen. The amount of oxygen provided in the process gas mixture is dependent upon the pattern and application of the etch process. The source power energized the process gas mixture into a plasma. "Oxygen," as used herein, may be used to refer to any oxygen containing gas as disclosed herein.

Figure 3B:
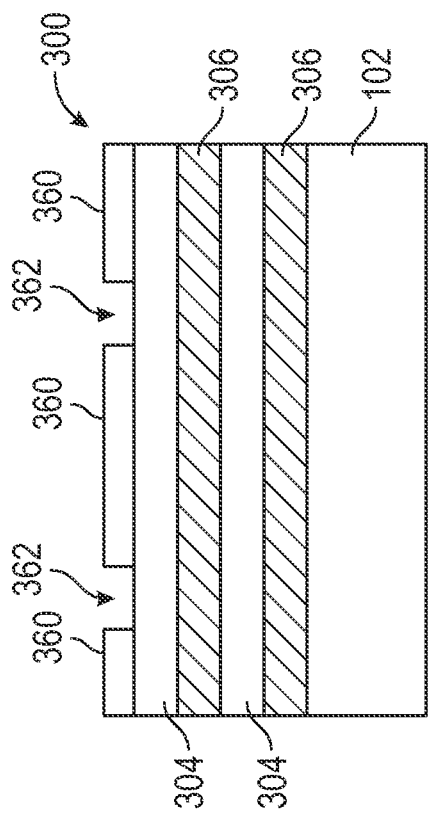

At operation 230, the bias power supply 150 provides a first bias voltage to the electrode 121, which attracts ions in the plasma formed by the process gases in the processing volume 101, to the substrate 102 positioned on the ESC 122. In some embodiments, the first bias power is from about 0 kilovolts (kV) to about 3 kV, such as from about 1 kV to about 2 kV. At operation 240, the oxide layer 304, as shown in FIG. 3B, is etched through the openings 362 formed in the etch mask 360 while providing the first bias from operation 230 to the substrate 102 and while providing the process gas from operation 220 to form a plurality of features 308 and expose a surface 310 of the nitride layer 306. In some embodiments, the second bias voltage achieves an Oxide-to-Silicon Nitride etch selectivity of about 2 or greater, such as about 3 or greater, such as about 3.2 or greater. Operation 240 is performed until an endpoint for etching the layer 304 is reached. The endpoint may be determined by any suitable manner, such as timed etch, optical emission spectroscopy (OES), laser interferometry, and the like.

Figure 3C:
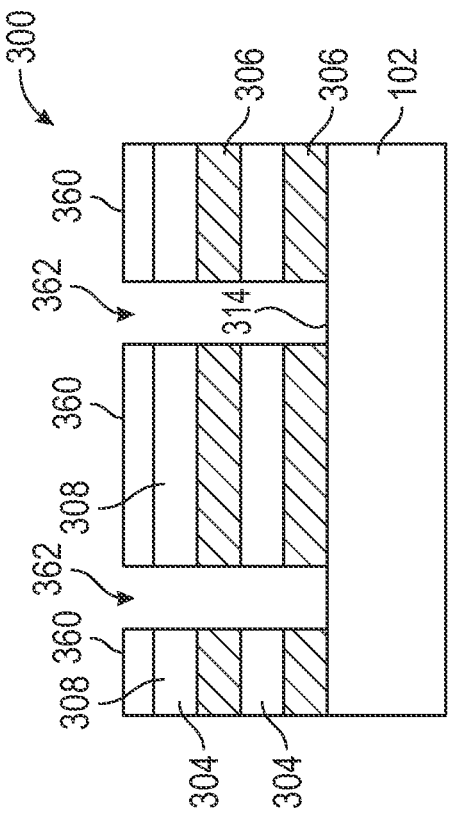

At operation 250 after the endpoint is detected, the bias power supply 150 provides a second bias voltage to the electrode 121. The second bias voltage is different than the first bias voltage. In one example, the second bias voltage is greater than the first bias voltage. The second bias voltage may be higher if the material layer to be etched has a higher bond energy. In some embodiments, the second bias voltage is from about 2 kV to about 8 kV, such as from about 3 kV to about 7 kV, such as from about 4 kV to about 6 kV, such as about 5 kV. At operation 260, as shown in FIG. 3C, the exposed surface 310 of the nitride layer 306 is etched through the openings 362 formed in the etch mask 360 while providing the second bias to the substrate 102 from operation 250 and while providing the process gas from operation 220 to expose a surface 312 of a the oxide layer 304. In some embodiments, the second bias voltage achieves a Silicon Nitride-to-Oxide etch selectivity of about 1 or greater, such as about 1.2 or greater, such as about 1.4 or greater. In some embodiments, the first or second bias voltage is absolute 0. In other embodiments, the first or second bias voltage is relatively close to 0 with respect to a higher voltage. For example, a first bias voltage of less than 1 kV may be considered 0 compared to a second bias voltage of about 2 kV or about 4 kV.

Figure 3D:
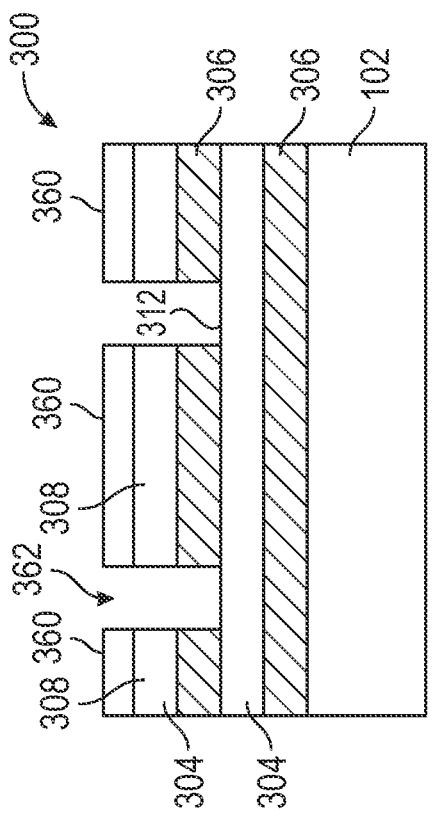

At optional operation 270, operations 230 through 260 are repeated to etch the oxide layer 304 and the nitride layer 306 with the first bias voltage and the second bias voltage, respectively, until a surface 314 of the substrate 102 is exposed, as shown in FIG. 3D. Alternatively, operations 230 through 260 may be repeated a set number of times.

It is contemplated that nitride-oxide films may be etched with methods similar to those described herein whereby the second bias voltage would be less than the first bias voltage.

According to embodiments of the present disclosure, a universal etch recipe may be utilized in conjunction with changes in a bias voltage to a substrate with a multi-layer film stack thereon in order to selectively etch the multi-layer film stack with decreased etch recipe transition periods. Changing the bias voltage is less time consumptive than changing the pressure or process gas flow/chemistry during an etch, thus less etch recipe transition period time is necessary between etch steps and the overall efficiency and throughput of the chamber can be increased. As shown herein, the etch recipe transition period can be reduced by 50% which results in 100% increase in overall throughput.

While the foregoing is directed to implementations of the present disclosure, other and further implementations of the disclosure may be devised without departing from the basic scope thereof, and the scope thereof is determined by the claims that follow.

What is claimed is:

1. A method for etching a film stack having stacked pairs of oxide and nitride layers, the method comprising:
    transferring a substrate having a film stack formed thereon into a processing chamber;
    providing a first bias voltage to the substrate;
    etching an oxide layer of the film stack with a first process gas recipe while providing the first bias voltage to the substrate;
    providing a second bias voltage to the substrate, the second bias voltage greater than the first bias voltage; and
    etching a nitride layer of the film stack with the first process gas recipe while providing the second bias voltage to the substrate.

2. The method of claim 1, wherein the providing the second bias voltage occurs after etching the oxide layer of the film stack.

3. The method of claim 1, wherein the oxide layer of the film stack is silicon oxide (SiO) and wherein the nitride layer of the film stack is silicon nitride (SiN).

4. The method of claim 3, wherein the first bias voltage is from about 0 kV to about 3 kV, the second bias voltage is from about 2 kV to about 8 kV.

5. The method of claim 1, further comprising:
    providing a process gas mixture to the substrate, the process gas mixture including $C_NF_M$, $C_XH_YF_Z$, and oxygen, wherein the subscripts n, m, x, y and z are positive integers.

6. The method of claim 5, wherein the oxygen comprises from about 25% to about 50% of the process gas mixture by volume.

7. The method of claim 5, wherein a composition of the process gas mixture remains substantially the same during the etching the oxide layer and the etching the nitride layer.

8. The method of claim 5, wherein the $C_NF_M$ gas is selected from the group consisting of $C_2F_4$, $C_4F_8$, $C_3F_6$, and $C_4F_6$, and wherein the CxHYFz gas is selected from the group consisting of $CHF_3$, $CH_2F_2$, and $CH_3F$.

9. The method of claim 1, wherein the oxide layer and the nitride layer are each from about 20 nm to about 30 nm thick.

10. The method of claim 1, wherein the first process gas recipe comprises:
    an etch gas type;
    an etch gas flow rate, and
    an etch gas pressure.

11. A method for etching a film stack having stacked pairs of oxide and nitride layers, the method comprising:
    transferring a substrate having a film stack formed thereon into a process chamber;
    providing a process gas mixture to the substrate, the process gas mixture including $C_NF_M$, $C_XH_YF_Z$, and oxygen, wherein the subscripts n, m, x, y and z are positive integers;
    providing a first bias voltage to the substrate;
    etching a first oxide layer of the film stack while providing the first bias voltage to the substrate and while providing the process gas mixture to the substrate;

providing a second bias voltage to the substrate, the second bias voltage greater than the first bias voltage;

etching a nitride layer of the film stack while providing the second bias voltage to the substrate and while providing the process gas mixture to the substrate;

providing a third bias voltage to the substrate, the third bias voltage less than the second bias voltage; and etching a second oxide layer of the film stack while providing the third bias voltage to the substrate and while providing the process gas mixture to the substrate.

12. The method of claim 11, wherein the oxide layer of the film stack is silicon oxide (SiO) and wherein the nitride layer of the film stack is silicon nitride (SiN).

13. The method of claim 12, wherein the first bias voltage is from about 0 kV to about 3 kV, the second bias voltage is from about 2 kV to about 8 kV.

14. The method of claim 13, wherein the first bias voltage is about 0 kV and the second bias voltage is about 2 kV.

15. The method of claim 14, wherein the etching the oxide layer achieves an oxide-to-silicon nitride etch selectivity of about 3.2 or greater.

16. The method of claim 14, wherein the etching the nitride layer achieves a silicon nitride-to-oxide etch selectivity of about 1.4 or greater.

17. The method of claim 11, wherein the $C_NF_M$ gas is selected from the group consisting of $C_2F_4$, $C_4F_8$, $C_3F_6$, and $C_4F_6$, and wherein the $C_XH_YF_Z$ gas is selected from the group consisting of $CHF_3$, $CH_2F_2$, and $CH^3F$.

18. The method of claim 11, wherein the first bias voltage and the second bias voltage are increased as an aspect ratio is increased.

19. A method for etching a film stack having stacked pairs of silicon oxide and silicon nitride layers, the method comprising:

transferring a substrate having a film stack formed thereon into a process chamber;

providing a process gas mixture to the substrate, the process gas mixture including $C_NF_M$, $C_XH_YF_Z$, and oxygen, wherein the subscripts n, m, x, y or z are positive integers, and wherein the oxygen comprises from about 25% to about 50% of the process gas mixture by volume;

providing a first bias voltage to the substrate;

etching a first silicon oxide layer of the film stack while providing the first bias voltage to the substrate and while providing the process gas mixture to the substrate;

providing a second bias voltage to the substrate, the second bias voltage greater than the first bias voltage;

etching a silicon nitride layer of the film stack while providing the second bias voltage to the substrate and while providing the process gas mixture to the substrate;

providing the first bias voltage to the substrate; and etching a second silicon oxide layer of the film stack while providing the first bias voltage to the substrate and while providing the process gas mixture to the substrate.

20. The method of claim 19, wherein the providing the second bias voltage occurs after etching the first layer of the film stack.

21. The method of claim 19, wherein the first bias voltage and the second bias voltage are increased as an aspect ratio is increased.

* * * * *